United States Patent
Nagatsuka et al.

(10) Patent No.: US 8,788,081 B2
(45) Date of Patent: Jul. 22, 2014

(54) APPLICATION OPERATION SIMULATION DEVICE

(75) Inventors: Yoshiharu Nagatsuka, Minamitsuru-gun (JP); Toshiya Takeda, Minamitsuru-gun (KR)

(73) Assignee: Fanuc Corporation, Minamitsuru-gun, Yamanashi (JP)

( * ) Notice: Subject to any disclaimer, the term of this patent is extended or adjusted under 35 U.S.C. 154(b) by 633 days.

(21) Appl. No.: 13/097,717

(22) Filed: Apr. 29, 2011

(65) Prior Publication Data

US 2012/0004751 A1    Jan. 5, 2012

(30) Foreign Application Priority Data

Jun. 30, 2010   (JP) .................................. 2010-149342

(51) Int. Cl.
*G06F 19/00* (2011.01)
*B29C 45/00* (2006.01)
*G06F 17/50* (2006.01)
*G06F 7/60* (2006.01)
*G06F 17/10* (2006.01)
*G06G 7/48* (2006.01)

(52) U.S. Cl.
USPC .......... 700/97; 700/200; 703/1; 703/2; 703/7; 901/43

(58) Field of Classification Search
USPC .................... 700/97, 200; 703/1, 2, 7; 901/43
See application file for complete search history.

(56) References Cited

U.S. PATENT DOCUMENTS

| | | | | |
|---|---|---|---|---|
| 4,484,120 A | * | 11/1984 | Olex et al. ................ | 318/568.14 |
| 5,645,884 A | * | 7/1997 | Harlow et al. .................... | 427/8 |
| 6,256,597 B1 | * | 7/2001 | Wang et al. ....................... | 703/2 |
| 6,466,844 B1 | * | 10/2002 | Ikeda et al. .................... | 700/245 |
| 6,529,860 B1 | * | 3/2003 | Strumolo et al. ................ | 703/8 |

FOREIGN PATENT DOCUMENTS

| | | |
|---|---|---|
| DE | 103 09 930 A1 | 9/2004 |
| DE | 10 2005 055 247 A1 | 9/2006 |
| JP | 2-83054 | 3/1990 |
| JP | 2007-160313 | 6/2007 |
| WO | WO 02/03309 | 1/2002 |

* cited by examiner

*Primary Examiner* — Mohammad Ali
*Assistant Examiner* — Ziaul Karim
(74) *Attorney, Agent, or Firm* — Drinker Biddle & Reath LLP

(57) ABSTRACT

An application operation simulation device including a specification section that specifies positions of nozzles with respect to a spray device and injection shapes of injected materials; an interference point calculation section that performs a working program of a robot including instructions for outputting the injected materials to operate a three-dimensional model of the robot by simulation and calculate interference points between three-dimensional models of the injection shapes and a three-dimensional model of an applied member; an interference number calculation section that calculates the number of interference at each interference point on a surface of the three-dimensional model of the applied member; an application time calculation section that calculates application time from the number of interference; and a display section that displays the color-coded surface of the three-dimensional model.

3 Claims, 6 Drawing Sheets

APPLICATION OPERATION SIMULATION DEVICE

RELATED APPLICATION DATA

This application claims priority under 35 U.S.C. §119 and/or §365 to Japanese Application No. 2010-149342 filed Jun. 30, 2010, the entire contents of which is incorporated herein by reference.

BACKGROUND OF THE INVENTION

1. Field of the Invention

The present invention relates to an application operation simulation device for performing a simulation of an application operation that uses a robot equipped with a spray device provided with at least one nozzles to move the spray device based on a working program and apply an injected material injected from the nozzles to an applied member while indicating a three-dimensional model of the robot and a three-dimensional model of the applied member at the same time on screen.

2. Description of the Related Art

When a robot is taught for an operation, an offline simulation is typically used. In an offline simulation device, only the operation of the robot is simulated. However, in the case of processing operations and the like using the robot, it is desired that a result of processing is also simulated.

One of the processing operations described above is an application operation in which a spray device of the robot injects an injected material. The simulation device for this application operation is widely used when paint is injected as an injected material. This simulation calculates an area to which the paint is applied and a film thickness of the paint to color-code the result on a three-dimensional model of a workpiece. Further, as disclosed in Japanese Unexamined Patent Publication No. 2007-160313, also when a mold-releasing agent as the injected material is injected into a die-casting die, the application operation simulation device may be used.

However, when the mold-releasing agent is injected into the die-casting die, it is difficult to use the simulation device for the following reasons.

First, when the mold-releasing agent is injected as injected material into the die-casting die, the mold-releasing agent does not adhere to the die and, consequently, in contrast to the case of the paint, it is not necessary to evaluate the thickness of the applied die-molding agent. In addition, in view of cooling the die, when the mold-releasing agent is injected into the die-casting die, when the mold-releasing agent is applied time is required. However, the typical application operation simulation device cannot calculate the application time.

Second, when the paint is injected as injected material it is assumed that the spray device is provided with only one nozzle. In contrast to this, the spray device that injects the mold-releasing agent as injected material into the die-casting die typically comprises a plurality of nozzles and, as a result, it is difficult to simulate the case in which the mold-releasing agent is injected from the plurality of nozzles.

The present invention has been made in light of these circumstances and an object of the present invention is to provide an application operation simulation device that can accommodate a spray device provided with a plurality of nozzles and that can calculate time when a mold-releasing agent is applied as an injected material.

SUMMARY OF THE INVENTION

In order to achieve the above object, according to a first aspect, there is provided an application operation simulation device for performing a simulation of an application operation that uses a robot equipped with a spray device provided with at least one nozzles to move the spray device based on a working program and apply an injected material from the nozzles to an applied member while indicating a three-dimensional model of said robot and a three-dimensional model of said applied member at the same time on screen, characterized in that the application operation simulation device comprises: a specification section that specifies positions of the nozzles with respect to said spray device and injection shapes of the injected materials injected from the nozzles; an interference point calculation section that performs the working program of said robot including instructions for outputting and stopping the injected material to operate the three-dimensional model of the robot by simulation and calculate interference points between the three-dimensional model of the injection shapes and the three-dimensional model of the applied member every predetermined time period; an interference number calculation section that calculates the number of interference every the predetermined time period at each of the interference points calculated by the interference point calculation section on a surface of the three-dimensional model of said applied member; an application time calculation section that calculates application time from the number of interference every said predetermined time period calculated by the interference number calculation section; and a display section that displays the color-coded surface of the three-dimensional model of the applied member according to the application time calculated by the application time calculation section.

According to a second aspect, in the first aspect, the spray device comprises a plurality of nozzles that inject the injected material at the same time, wherein the three-dimensional models of the injection shapes of each of the nozzles are specified by the specified section to simulate said application operation.

These and other objects, features and advantages of the present invention will be more apparent in light of the detailed description of exemplary embodiments thereof as illustrated by the drawings.

DETAILED DESCRIPTION

Figure 1:
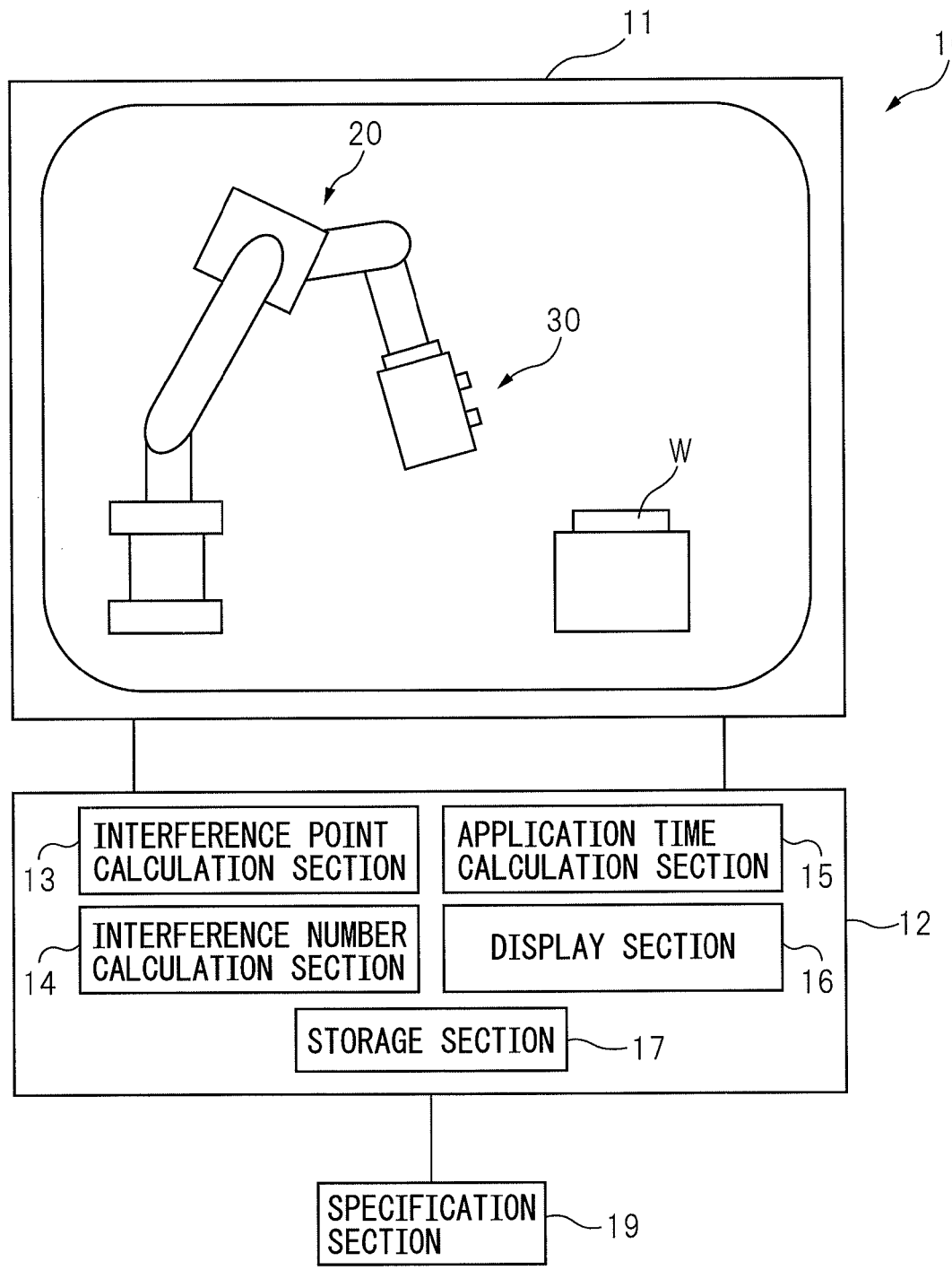
FIG. 1 is a schematic diagram of an application operation simulation device according to the present invention.

Hereinafter, embodiments of the present invention will be described with reference to the accompanying drawings. In the drawings, like members are designated by like reference numerals. For ease of understanding, the scale of the drawings has been changed appropriately.

FIG. 1 is a schematic diagram of an application operation simulation device according to the present invention. As illustrated in FIG. 1, an application operation simulation device 10 is a digital computer that mainly comprises a screen 11 and a control section 12.

Screen 11 is a CRT, liquid crystal monitor and the like. In FIG. 1, a three-dimensional model of a spray device 30 provided with nozzles and a three-dimensional model of a robot 20 equipped with spray device 30 are indicated. Further, in screen 11, a three-dimensional model of an applied member, for example, a die-casting die W is indicated. Hereinafter, the three-dimensional models will be simply referred to as "spray device 30", "robot 20" and "die-casting die W".

Further, for example, robot 20 is a 6-axis vertical articulated robot. In FIG. 1, spray device 30 is mounted on an arm tip of robot 20. Further, spray device 30 is provided with a plurality of nozzles that can inject an injected material such as a mold-releasing agent.

Control section 12 is connected to a specification section 19, for example, a mouse and keyboard. Thanks to specification section 19, positions of the nozzles with respect to a main body of spray device 30 and injection shapes of the mold-releasing agent injected from the nozzles can be specified as described below.

Further, control section 12 includes a storage section 17 that stores a working program including operation instructions of the robot and driving instructions of spray device 30. This storage section 17 may store various thresholds, data and the like.

Further, control section 12 includes an interference point calculation section 13 that calculates interference points between the three-dimensional models of the injection shapes of the mold-releasing agent and the three-dimensional model of die-casting die W every predetermined time period when a simulation is performed based on the working program. Further, control section 12 includes an interference number calculation section 14 that calculates the number of interference at each of the interference points calculated by interference point calculation section 13 on a surface of the three-dimensional model of die-casting die W. The expression "predetermined time period" means a predetermined control time period of application operation simulation device 10.

Still further, control section 12 includes an application time calculation section 15 that calculates the application time from the number of interference every predetermined time period calculated by interference number calculation section 14, and a display section 16 that displays the color-coded surface of the three-dimensional model of die-casting die W according to the calculated application time.

Figure 2:
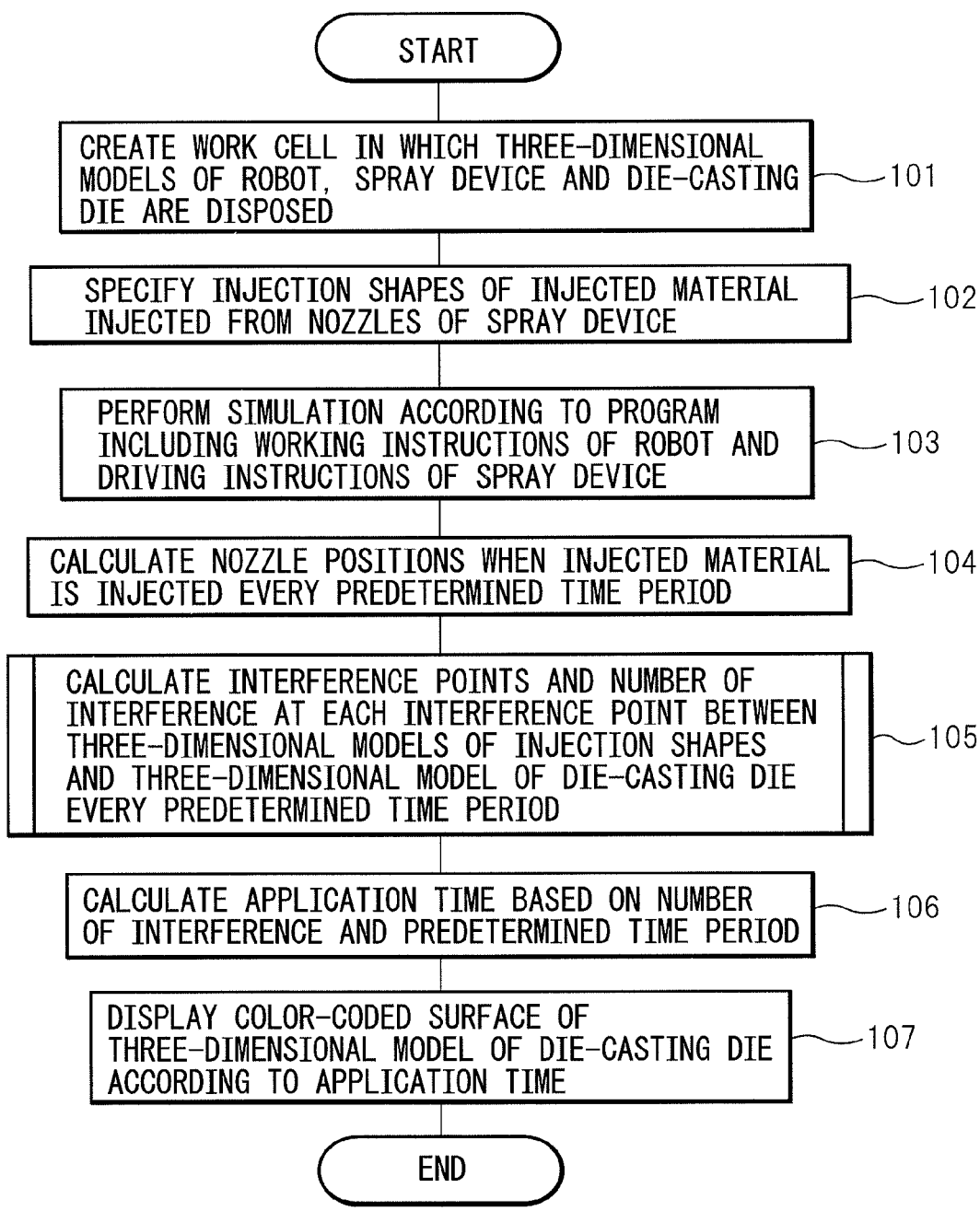
FIG. 2 is a flowchart illustrating operation of an application operation simulation device according to the present invention.

FIG. 2 is a flowchart illustrating operation of an application operation simulation device. Hereinafter, based on FIG. 2, the operation of application operation simulation device 10 will be described.

First, in step 101, a work cell in which an application operation is performed to apply a mold-releasing agent to die-casting die W is created on screen 11. The work cell is mainly comprised of the three-dimensional models of robot 20, spray device 30 and die-casting die W. In the work cell, the relative positions of robot 20 provided with spray device 30 and die-casting die W are the same as those of robot 20 and die-casting die W in a real application operation.

Figure 3:
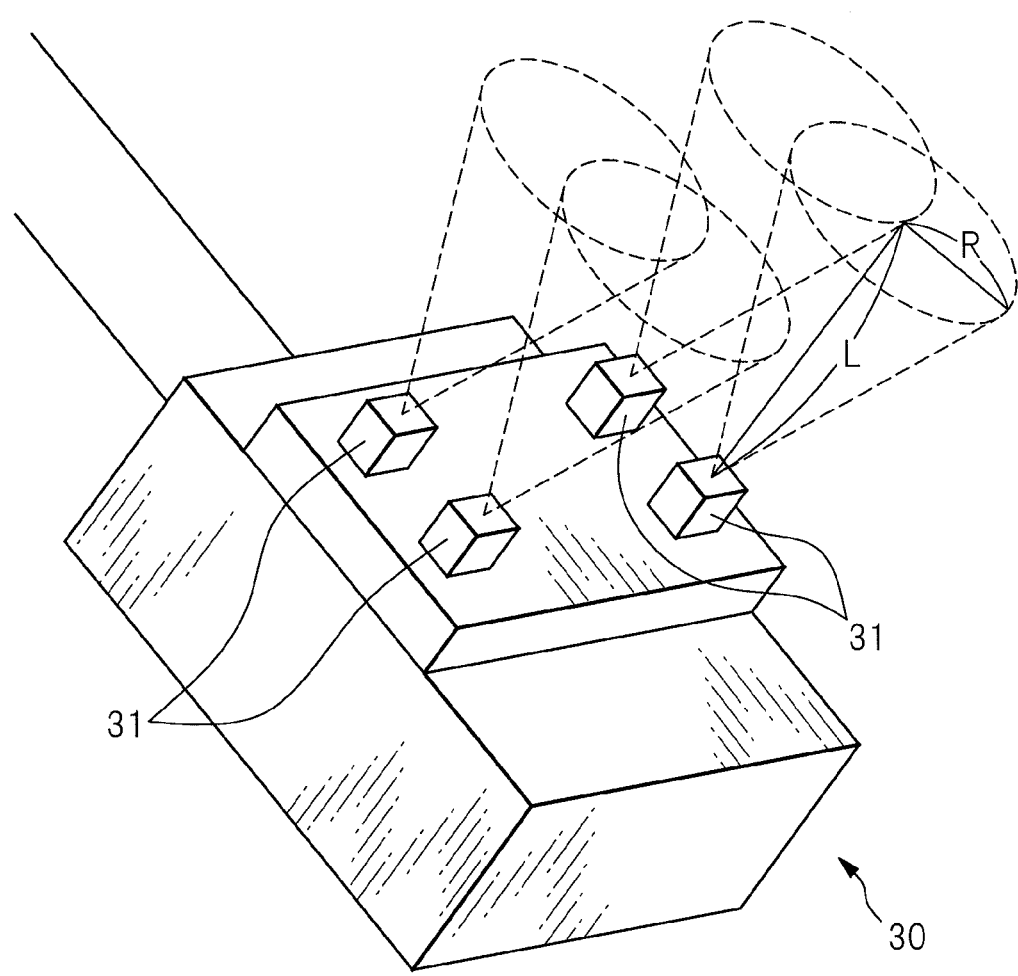
FIG. 3 is a perspective view illustrating three-dimensional models of a spray device, nozzles and injection shapes.

Then, in step 102, the three-dimensional models of the injection shapes of the mold-releasing agent injected from the nozzles of spray device 30 is specified. FIG. 3 is a perspective view illustrating the three-dimensional models of the spray device, nozzles and injection shapes. As illustrated in FIG. 3, spray device 30 comprises a plurality of (for example, four) nozzles 31 of the same shape. It can be assumed that the mold-releasing agent is injected conically from these nozzles 31.

Consequently, in step 102, the maximum attainable distance L and a radius R at this maximum attainable distance L of the mold-releasing agent injected from nozzles 31 are specified by specification section 19. As a result, cones each having a height L and a bottom radius R can be established as the three-dimensional models of the injection shapes of the mold-releasing agent. When there are a plurality of nozzles 31, the maximum attainable distances L and the radii R may be specified independently for each nozzle 31 or, alternatively, the maximum attainable distance L and the radius R of common dimensions may be specified for the each of the plurality of nozzles 31.

The surface of the three-dimensional model of die-casting die W is expressed as a triangular mesh. It is assumed that all sides in this triangular mesh are sufficiently short in length. If there is a large triangle in this triangular mesh, the large triangle should be divided automatically until the resultant triangles become sufficiently small by, for example, bisecting the longest side of the large triangle with a segment interconnecting the center of the longest side and the vertex of the triangle other than the both ends of the longest side.

Returning to FIG. 2, in step 103 of FIG. 2, application operation simulation device 10 performs the simulation based on the working program stored in storage section 17. Alternatively, a teaching program of robot 20 may be created on the work cell and the simulation may be performed based on the teaching program.

Such program includes movement instructions for moving robot 20, driving instructions of nozzles 31 for outputting and stopping the mold-releasing agent, and times when these instructions are performed. When application operation simulation device 10 performs the simulation, the position of robot 20 and the state of nozzles 31 can be obtained. As a result, the positions of nozzles 31 when the mold-releasing agent is injected can be grasped every predetermined time period (step 104).

Figure 4:
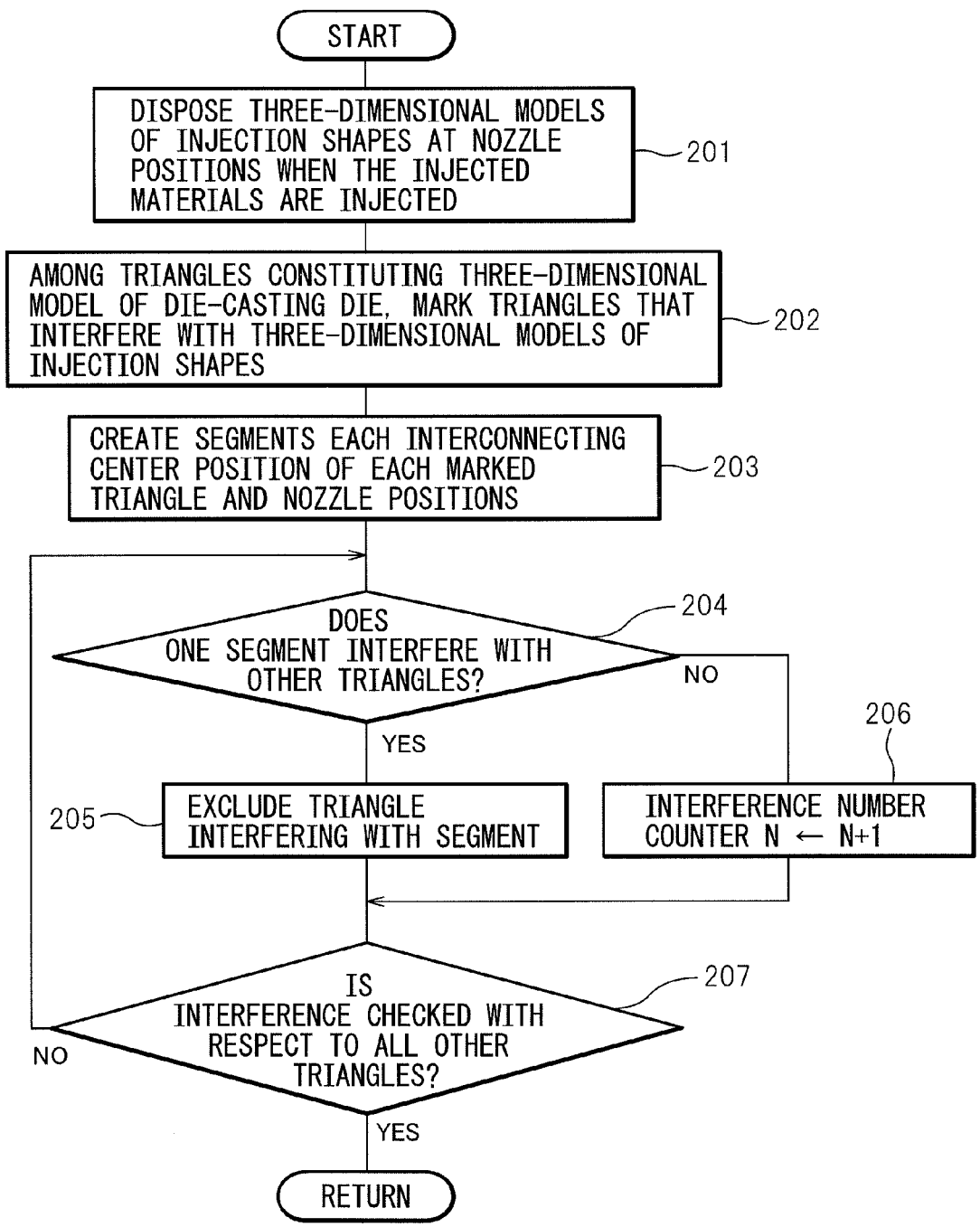
FIG. 4 is a flowchart illustrating operation for calculating interference points and the number of interference between the three-dimensional models of the injection shapes and the three-dimensional model of a die-casting die.

Then, in step 105, interference point calculation section 13 and interference number calculation section 14 calculate the interference points and the number of interference for each interference point every predetermined time period, respectively, between the three-dimensional models of the injection shapes of the mold-releasing agent and the three-dimensional model of die-casting die W. FIG. 4 is a flowchart illustrating the operation for calculating the interference points and the number of interference between the three-dimensional models of the injection shapes and the three-dimensional model of the die-casting die. Hereinafter, referring to FIG. 4, the calculation of the interference points and the like will be specifically described.

First, in step 201, robot 20 is moved on the work cell to dispose the three-dimensional models of the injection shapes at each nozzle position when the mold-releasing agent is injected. Then, in step 202, interference point calculation section 13 checks the interference of all the triangular mesh constituting the three-dimensional model of die-casting die W with the three-dimensional models of the injection shapes. Then, the triangles in the mesh of die-casting die W that interfere with the three-dimensional models of the injection shapes are marked.

Figure 5:
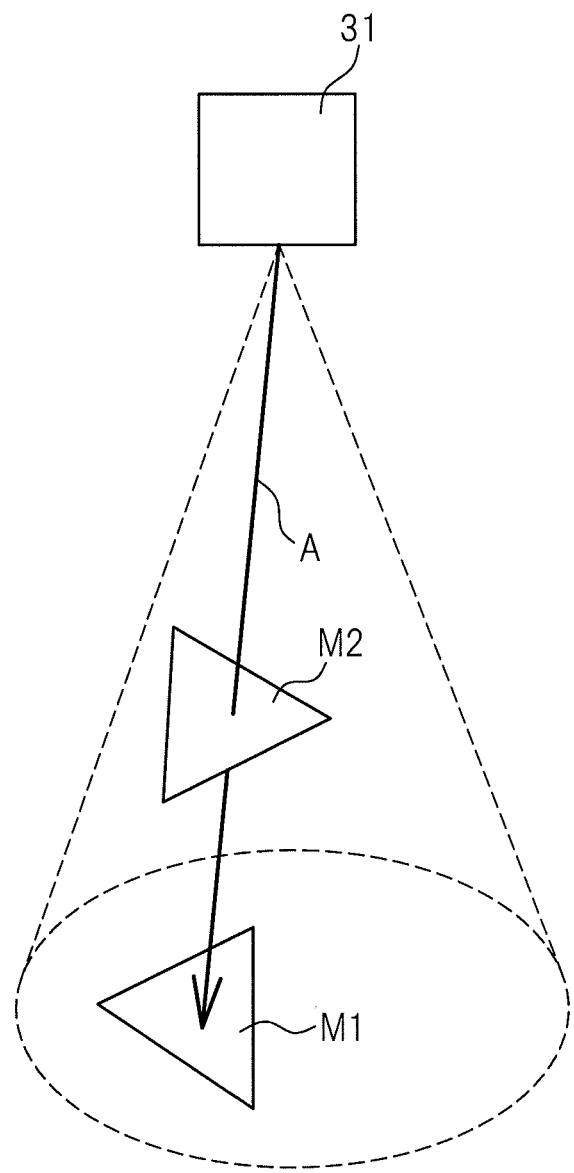
FIG. 5 is a diagram illustrating a three-dimensional model of an injection shape.

FIG. 5 is a diagram illustrating a three-dimensional model of an injection shape. In FIG. 5, a marked triangle M1 in the mesh is illustrated. In step 203, as illustrated in FIG. 5, a segment A that interconnects a center position of triangle M1 in the mesh and nozzle 31 is determined. This segment A represents a trajectory of the mold-releasing agent injected from nozzle 31 till it reaches a point on triangle M1 in the mesh.

Then, in step 204, it is checked whether there is interference between segment A and any other marked triangle in the mesh such as, for example, a triangle M2 or not. Then, if there is the interference between triangle M1 and the other triangle M2 in the mesh, it can be judged that triangle M1 is hidden by the other triangle M2 in the mesh so that the mold-releasing agent is not actually applied to triangle M1 in the mesh. Consequently, the marking of triangle M1 in the mesh is removed to exclude triangle M1 (step 205).

In contrast, if it is determined that triangle M1 does not interfere with any other triangle in the mesh such as, for example, triangle M2, interference point calculation section 13 determines that triangle M1 in the mesh is an interference point. Then, interference number calculation section 14 adds "1" to a counter of the number of interference N. Then, in step 207, it is determined whether the interference with triangle M1 is checked with respect to all other triangles in the mesh or not and the process from step 204 to step 207 is repeated till the interference is checked with respect to all other triangles in the mesh. The process described above is repeated every predetermined time period when the mold-releasing agent is injected. As described above, in the working program, the number of interference N is determined every interference point (every triangle in the mesh).

Returning to FIG. 2, in step 106, application time calculation section 15 multiplies the number of interference by the predetermined time period to calculate an application time T during which the mold-releasing agent is applied for each interference point. As described above, when the mold-releasing agent is injected, it is not necessary to evaluate thickness of the applied agent. However, in view of cooling die-casting die W, it is important to calculate the application time T when the mold-releasing agent is injected to die-casting die W.

Figure 6:
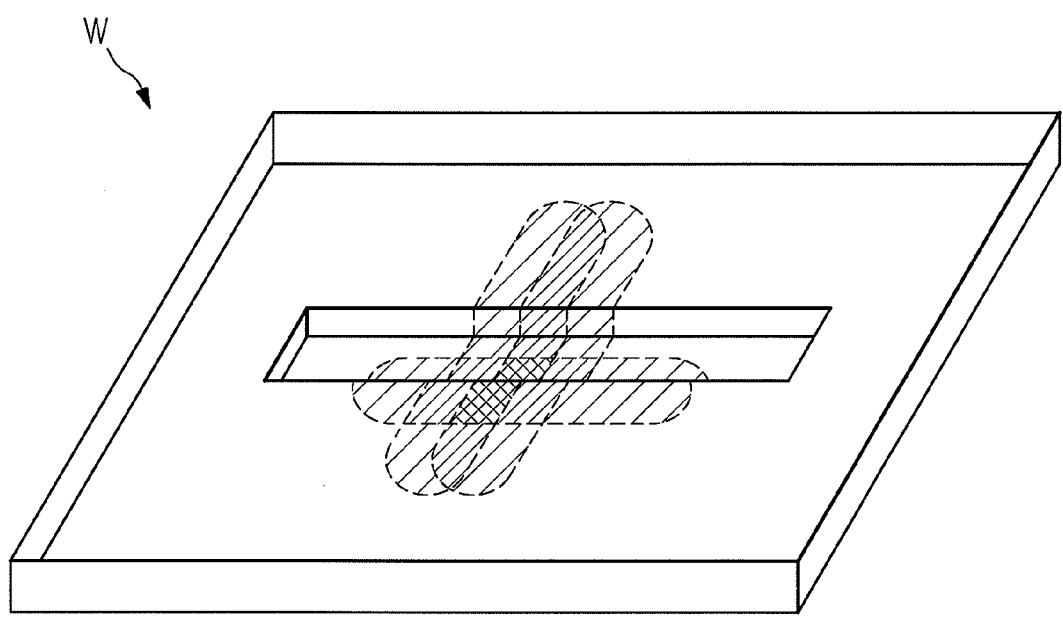
FIG. 6 is a diagram illustrating a state in which a surface of a three-dimensional model of a die-casting die is color-coded.

After that, proceeding to step 107, colors of the three-dimensional model of die-casting die W are selected for each interference point according to the application time T and display section 16 indicates the selected colors of the three-dimensional model of die-casting die W on screen 11. FIG. 6 is a diagram illustrating a state in which a surface of the three-dimensional model of the die-casting die is color-coded. As illustrated in FIG. 6, typically, the longer the application time T is, the darker color is selected. Consequently, by changing the colors in a stepwise manner according to the application time T of the mold-releasing agent, a range in which the mold-releasing agent is applied and the application time T can be indicated at the same time.

Thus, in the present invention, the three-dimensional models of the injection shapes are created so that the interference between the three-dimensional models of the injection shapes and the three-dimensional model of die-casting die W is taken into consideration. As a result, when the spray device comprises a plurality of nozzles, the three-dimensional models of the plurality of injection shapes can be disposed to perform the appropriate simulation. Further, the application time required to apply the mold-releasing agent can be calculated easily and, when the mold-releasing agent is applied to the die-casting die, its effectiveness can be determined.

Further, in the present invention, as the mold-releasing agent can be displayed on the surface of the three-dimensional model of the applied member and color-coded according to the application time, it can be easily and visually determined whether there is an area to which the mold-releasing agent is not sufficiently applied or not in a short period of time. As a result, teaching of the robot can be improved and the teaching time can be shortened.

Effect Of The Invention

In the first and second aspects, the interference between the three-dimensional models of the injection shapes and the three-dimensional model of said applied member is taken into consideration. As a result, even if the spray device comprises a plurality of nozzles, the simulation can be performed appropriately and, further, the time when the mold-releasing agent is applied as an injected material can be calculated easily.

Further, as the injected material can be displayed on the surface of the three-dimensional model of the applied member and color-coded according to the application time, it can be determined whether there is an area to which the injected material is not sufficiently applied or not easily and visually. As a result, the teaching quality of the robot can be improved and the teaching time can be shortened.

Although the invention has been shown and described with exemplary embodiments thereof, it should be understood by those skilled in the art that the foregoing and various other changes, omissions and additions may be made therein and thereto without departing from the spirit of the scope of the invention.

The invention claimed is:

1. An application operation simulation device for performing a simulation of an application operation that uses a robot equipped with a spray device provided with at least one nozzle to move said spray device based on a working program and apply an injected material from said nozzle to an applied member while indicating a three-dimensional model of said robot and a three-dimensional model of said applied member at a same time on screen, the application operation simulation device comprising:

a specification section that specifies positions of said nozzle with respect to said spray device and injection shapes of the injected materials injected from said nozzle;

an interference point calculation section that performs the working program of said robot including instructions for outputting and stopping said injected material to operate the three-dimensional model of said robot by simulation and to calculate interference points between the three-dimensional model of said injection shapes and the three-dimensional model of said applied member every predetermined time period;

an interference number calculation section that calculates a number of interference every said predetermined time period at each of said interference points calculated by said interference point calculation section on a surface of the three-dimensional model of said applied member;

an application time calculation section that calculates an application time of the injected material at each of the interference points by multiplying said predetermined time period with the number of interference calculated by said interference number calculation section; and a display section that displays a color-coded surface of the three-dimensional model of said applied member according to the application time calculated by said application time calculation section, so that application operation simulation device is capable of improving a teaching of the robot and shortening a teaching time of the robot.

2. An application operation simulation device according to claim 1, wherein said spray device comprises a plurality of nozzles that inject the injected material at the same time, wherein the three-dimensional models of the injection shapes of each of said nozzles are specified by the specified section to simulate said application operation.

3. An application operation simulation device according to claim 1, wherein the interference point calculation section checks the interference of all triangular mesh of the three-dimensional model of said applied member with the three-dimensional model of said injection shapes every predetermined time period and calculates the triangular mesh, interfering with the three-dimensional model of said injection shapes, as interference points.

\* \* \* \* \*